United States Patent
Devin et al.

(10) Patent No.: US 6,621,720 B1
(45) Date of Patent: Sep. 16, 2003

(54) VOLTAGE PRODUCTION CIRCUIT

(75) Inventors: Jean Devin, Le Tholonet (FR); Mohamad Chehadi, Aix-en-Provence (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 10/019,771

(22) PCT Filed: Jun. 26, 2000

(86) PCT No.: PCT/FR00/01776

§ 371 (c)(1),
(2), (4) Date: Dec. 27, 2001

(87) PCT Pub. No.: WO01/03141

PCT Pub. Date: Jan. 11, 2001

(65) Prior Publication Data (65)

(30) Foreign Application Priority Data

Jun. 30, 1999 (FR) ............................................. 99 08663

(51) Int. Cl.⁷ ................................................ H02M 3/18
(52) U.S. Cl. ........................................................ 363/59
(58) Field of Search ..................... 363/59, 60; 327/530, 327/538; 365/226

(56) References Cited

U.S. PATENT DOCUMENTS

| | | | | |
|---|---|---|---|---|
| 6,134,130 A | * | 10/2000 | Connell et al. | ................ 363/89 |
| 6,173,899 B1 | * | 1/2001 | Rozin | .......................... 235/492 |
| 6,218,819 B1 | * | 4/2001 | Tiwari | .......................... 323/285 |
| 6,342,844 B1 | * | 1/2002 | Rozin | .......................... 340/933 |
| 6,466,126 B2 | * | 10/2002 | Collins et al. | ............... 340/333 |

* cited by examiner

*Primary Examiner*—Adolf D. Berhane
(74) *Attorney, Agent, or Firm*—Lisa K. Jorgenson; Allen, Dyer, Doppelt, Milbrath & Gilchrist, P.A.

(57) ABSTRACT

The integrated circuit includes a detection circuit and a rectifier circuit that are series-connected, to provide a rectified voltage, and a low voltage regulation circuit that receives the rectified voltage and provides a low voltage. According to the invention, the circuit also has a voltage production circuit that receives the rectified voltage and produces a high voltage different from the low voltage. In one embodiment, the circuit also includes a memory having a memory array receiving the low voltage and the high voltage.

54 Claims, 4 Drawing Sheets

VOLTAGE PRODUCTION CIRCUIT

FIELD OF THE INVENTION

The invention is related to the field of voltage production circuits, and, more particularly, to contactless chip cards or smart cards having an electrically erasable and programmable memory.

BACKGROUND OF THE INVENTION

FIG. 1 is a standard diagram of an integrated circuit for contactless smart cards. The integrated circuit comprises a detection circuit 10, a rectifier circuit 20, a filter 30, a low-voltage regulation circuit 34, modulation and demodulation circuits 36, a logic circuit 38 and a memory 40. The detection circuit 10 comprises a resonant circuit, including an antenna loop represented by the turns of a winding 11, and a capacitor 12. The elements 11 and 12 are parallel-connected. The rectifier circuit 20 comprises a four-diode bridge 21 and a capacitor 22 having one of its terminals connected to ground.

The filter 30 has a resistor 31 and a capacitor 32. One of the terminals of the resistor 31 is connected to the common point 23 of one of the outputs of the bridge of diodes 21 and the capacitor 22. Another terminal of the resistor 31 is connected to one of the terminals of the capacitor 32 and to an output 33 of the filter 30. Another terminal of the capacitor 32 is connected to ground.

The low-voltage regulation circuit 34 comprises an input terminal connected to the output terminal 33 of the filter 30 and an output terminal 35 connected to the modulation and demodulation circuits 36, the logic circuit 38 and the memory 40. The modulation and demodulation circuits 36 comprise an input terminal connected to the common point 23 and an output terminal connected to the logic circuit 38 and the memory 40. The low-voltage regulation circuit 34 as well as the modulation and demodulation circuits 36 are formed of transistors, resistors and capacitors in a conventional manner as would be appreciated by the skilled artisan.

In contactless smart cards, the data as well as the power received by the chip are transmitted by the reader in the form of an amplitude-modulated RF signal. The signal received by the card is detected and then rectified by the detection circuit 10 and the rectifier circuit 12 to give a rectified voltage $HV_1$ to the common point 23. The mean amplitude of this rectified voltage $HV_1$ varies according to the mean power received by the card. This mean power depends mainly on the distance between the card and the reader. When the card is close to the reader, about a few centimeters, the amplitude of the rectified voltage $HV_1$ can thus reach 15–20 V, with an appropriate detection circuit.

The filter 30 lowers the level of the rectified voltage $HV_1$. Then, through the regulation circuit 34, a stable, DC low supply voltage $V_{cc}$ of about 4 V to 5 V is obtained at the output terminal 35. The assembly formed by the detection circuit 10 and the rectification circuit 20, the filter 30 and the low-voltage regulation circuit 34 is thus equivalent to a source of stable voltage that provides a low supply voltage $V_{cc}$. This source of stable voltage supplies power to all the circuits of the smart card and especially the modulation and demodulation circuits 36, the logic circuit 38 and the memory 40. At the same time, the modulation and demodulation circuits 36 decode the voltage $HV_1$ and provide a binary signal DATA, containing the data transmitted to the card, the logic circuit 38 and the memory 40.

The memory 40 is an electrically erasable and programmable memory, for example of the EEPROM type. It comprises a memory array 42 storing the data received by the card and a logic circuit 44 to control read and/or write operations in the memory array 42. To carry out a write operation in the memory array 42, it is necessary to have a voltage of about 16 to 18 V. For this, a voltage step-up circuit 46 provides a stable, DC high programming voltage HT from the low supply voltage $V_{cc}$. The voltage step-up circuit 46 is, for example, of the charge pump type, and is made of capacitors, transistors and/or diodes according to known techniques.

The smart card receives a limited quantity of energy. Hence, a write operation is most usually performed alone in order to make the best possible use of the power received by the card. Nevertheless, to provide the high programming voltage HT, the charge pump consumes substantial current and hence a large quantity of energy. This causes an overload on the supply voltage source that gives the low voltage $V_{cc}$. This overload could lead to a loss of the data received by the card, the erroneous storage of this data or else a break in communication between the reader and the smart card.

Moreover, a conventional charge pump takes up a large silicon surface area of up to 20% of the silicon surface area used for the memory. Indeed, the elements that form this charge pump, especially the capacitors and transistors, are bulky because their sizes are determined so that they can withstand high levels of voltage and power. Lastly, a charge pump is fragile, in particular because the capacitors forming it stand up rather poorly to excessively high voltages.

Given the characteristic disadvantages of the charge pump, it would therefore be worthwhile to eliminate it from a smart card memory, provided however that it is possible to have a stable, DC high voltage source, since this is indispensable for memory write operations.

SUMMARY OF THE INVENTION

An object of the invention is to provide an integrated circuit comprising a detection circuit and a rectifier circuit, series-connected to give a rectified voltage, and a low-voltage regulation circuit that receives the rectified voltage and gives a low supply voltage. According to the invention, the integrated circuit also comprises a voltage production circuit that receives the rectified voltage and produces a high voltage different from the low voltage. Thus, with the invention, the high voltage is no longer produced from the low supply voltage but directly from the rectified voltage, thus enabling the elimination of the charge pump commonly used.

The invention has the advantage of separating the voltage production circuit from the low voltage regulation circuit which provides the low supply voltage and from the circuits that are connected to it. Any malfunction in these circuits, due to the overloading of the low-voltage regulation circuit, is thus avoided. The transfer of data between the reader and the card is also avoided since the transfer is managed solely by the modulation and demodulation circuit and the logic circuit.

Furthermore, the voltage production circuit of the invention is far smaller and less fragile, and consumes far less energy than a charge pump as will be seen more clearly here below. Finally, by eliminating the charge pump commonly used in the memories, the invention provides for considerable savings in silicon surface area. This advantage is particularly valuable for applications such as electronic labels which require smaller circuits. According to one use of the invention, the integrated circuit also comprises a memory comprising a memory array, the memory array receiving the low voltage and the high voltage. The memory array is thus powered directly by the voltage production circuit and no longer by a charge pump internal to the memory.

According to one embodiment of the invention, the voltage production circuit is simply a wire. This embodiment is particularly simple to implement and it may be sufficient if the integrated circuit is used always at the same distance, of some centimeters, from the reader. In this case, the variation in the amplitude of the rectified voltage is fairly small.

According to another embodiment, the voltage production circuit comprises a controlled switch that is closed when it receives an active control signal (WRITE), and open otherwise. The control signal (WRITE) is for example a signal given by the logic circuit of the memory, if this logic circuit exists, or else by any other logic circuit of the integrated circuit. This embodiment has the advantage of applying the high voltage, equal to the rectified voltage, only when a control signal is given, namely only when it is necessary. The total consumption of the integrated circuit is thus limited.

According to another embodiment, the voltage production circuit comprises the controlled switch which receives the rectified voltage, and provides an intermediate voltage that is equal to either the rectified voltage if it is closed or to zero if it is open, and a high voltage circuit that receives the intermediate voltage, provides the high voltage and opens or closes the switch to regulate the high voltage. Thus, according to this embodiment, a regulation circuit is placed in series after the switch. Thus, the voltage production circuit continually provides a constant, regulated high voltage.

Finally, according to another embodiment, the voltage production circuit comprises the controlled switch which receives the rectified voltage and provides the intermediate voltage, a high voltage circuit that receives the intermediate voltage, and provides the high voltage and a regulation signal to regulate the high voltage, and a control circuit that receives the regulation signal and the control signal, and provides a closing signal to close or open the controlled switch. According to this embodiment, the voltage production circuit provides a stable DC voltage, particularly well suited to the programming of a memory. Furthermore, the circuit consumes energy only when a high voltage is necessary. This limits the total consumption of the integrated circuit.

Preferably, the control circuit comprises a hysteresis circuit to compare the regulation signal with first and second thresholds and provide the result of the comparison at an output of the comparator, and a logic gate comprising a first input receiving the result of the comparison and a second input receiving the control signal, the logic gate providing the closing signal. Preferably again, the closing signal takes a first logic value, which leads to the closing of the controlled switch, when the control signal is in a first logic state and when the high voltage increases and is below a high threshold, and wherein the closing signal takes a second logic value, which leads to the opening of the switch, when the control signal is in the first logic state and when the high voltage diminishes and is higher than a low threshold, or else when the control signal is in a second logic state. Preferably again, the high voltage circuit comprises at least one filtering capacitor to filter the intermediate voltage and a high voltage detection circuit to provide the regulation signal.

To separate the voltage production circuit even more completely from the low voltage regulation circuit that provides the low supply voltage and, at the same time, to increase the quantity of energy received by the smart card, another embodiment of the invention includes the addition of second rectifier and detection circuits to separately supply power to the voltage production circuit. Lastly, the invention is also directed to a smart card comprising an integrated circuit such as the one described above.

BRIEF DESCRIPTION OF THE DRAWINGS

The invention will be understood better and other characteristics and advantages will appear from the following description made with reference to the appended drawings, of which.

DETAILED DESCRIPTION OF THE PREFERRED EMBODIMENTS

Figure 1:
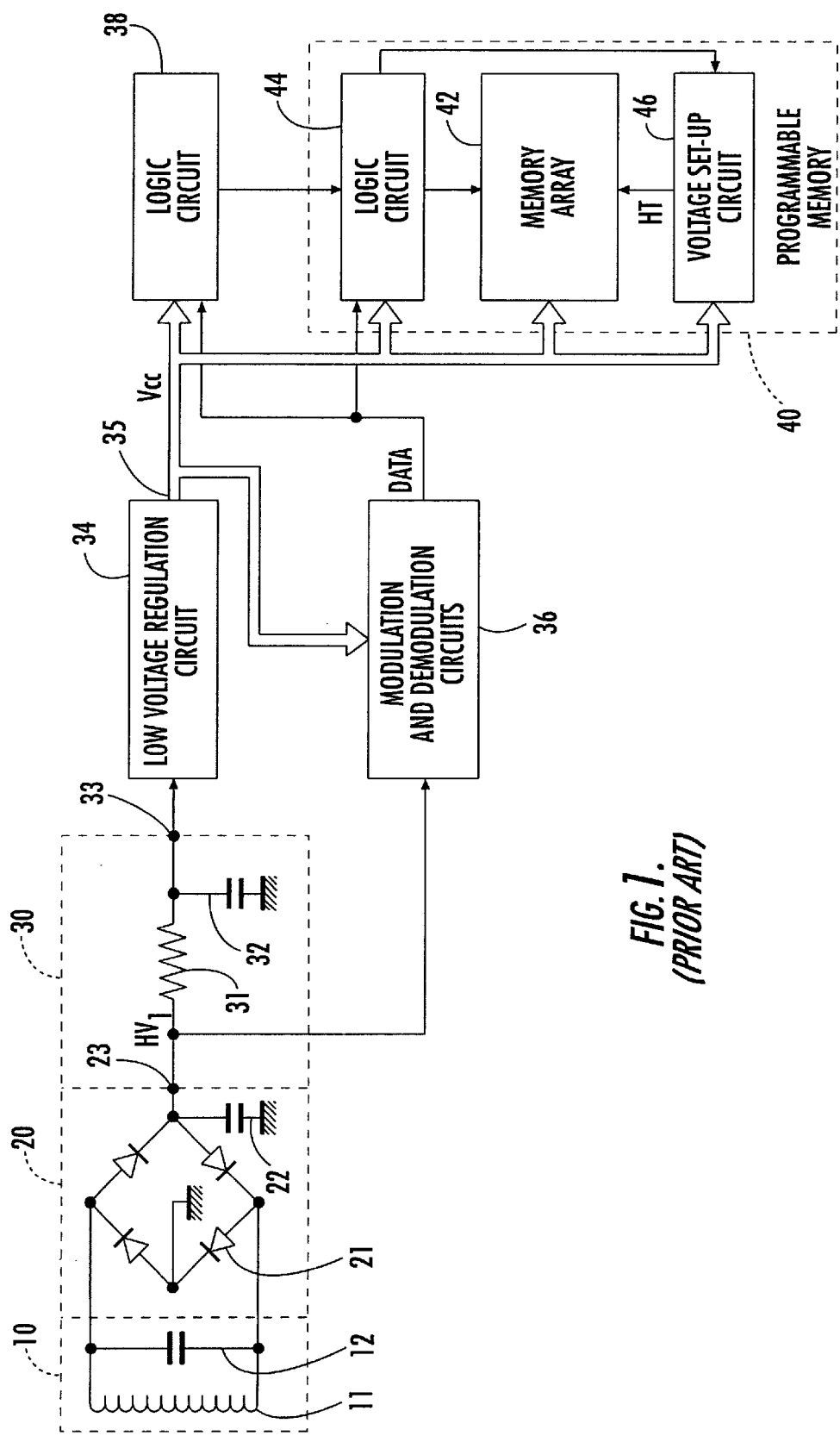
FIG. 1 is a block diagram illustrating an integrated circuit for contactless smart cards according to the prior art.

FIG. 1 has already been described and pertains to the prior art. It shall therefore not be described in greater detail. The elements of FIG. 2 and FIG. 1 that bear the same references are identical.

Figure 2:
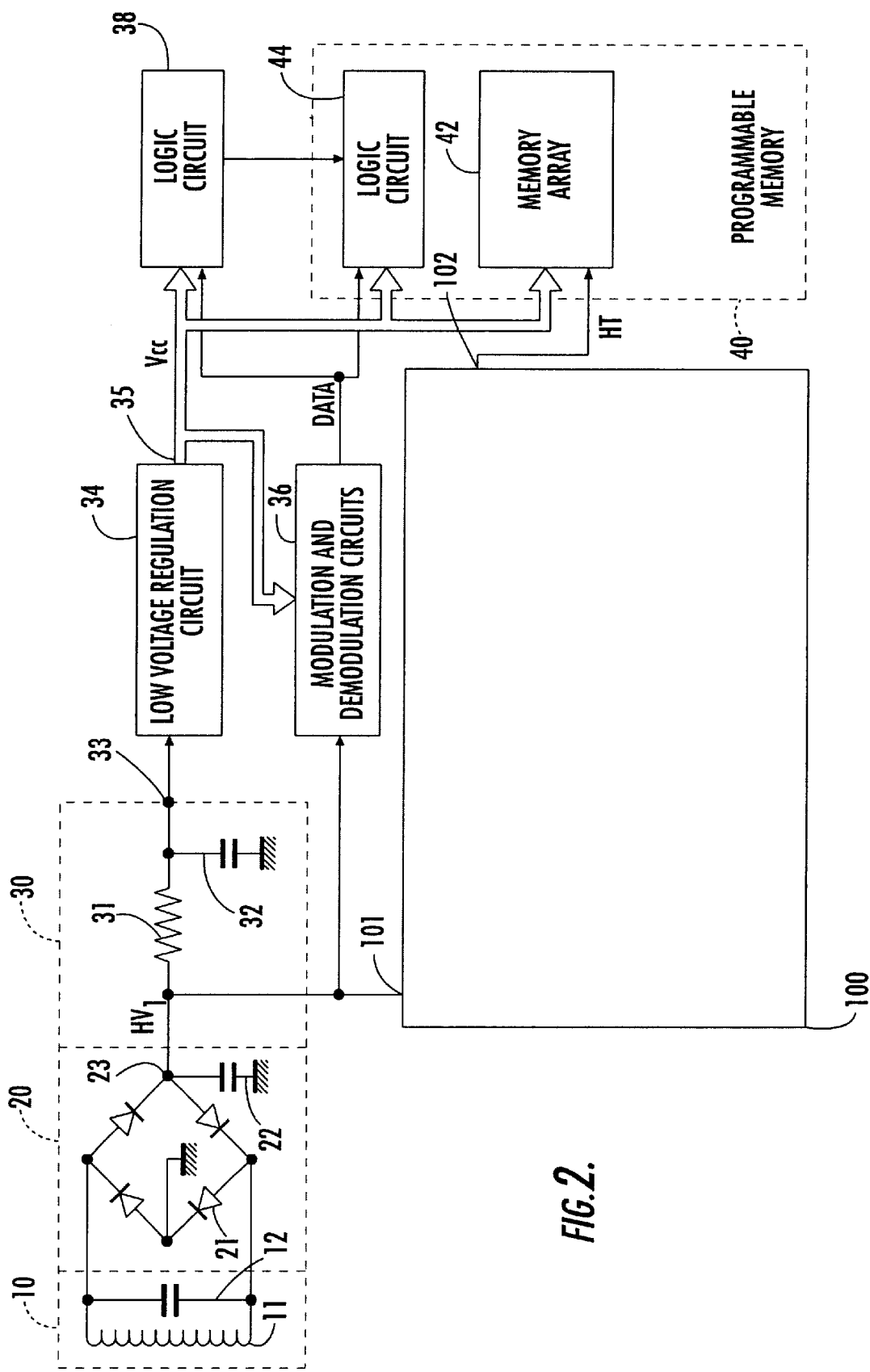
FIG. 2 is a block diagram illustrating an integrated circuit according to the invention.

The charge pump 46 of FIG. 1 has been eliminated in FIG. 2 and replaced by a voltage production circuit 100 according to the invention. The rectified voltage is applied to an input terminal 101 of the circuit 100, which provides the high voltage HT at an output terminal 102. The high voltage HT is thus provided from the rectified voltage and not from the low supply voltage as was conventional. According to a first embodiment (not shown in detail), the voltage production circuit 100 includes a wire connected between the common point 23 and the memory array 42.

According to another embodiment (not shown in detail), the voltage production circuit 100 comprises a switch series-connected with a high-voltage circuit that regulates the rectified voltage in controlling the opening or the closing of the switch.

Figure 3:
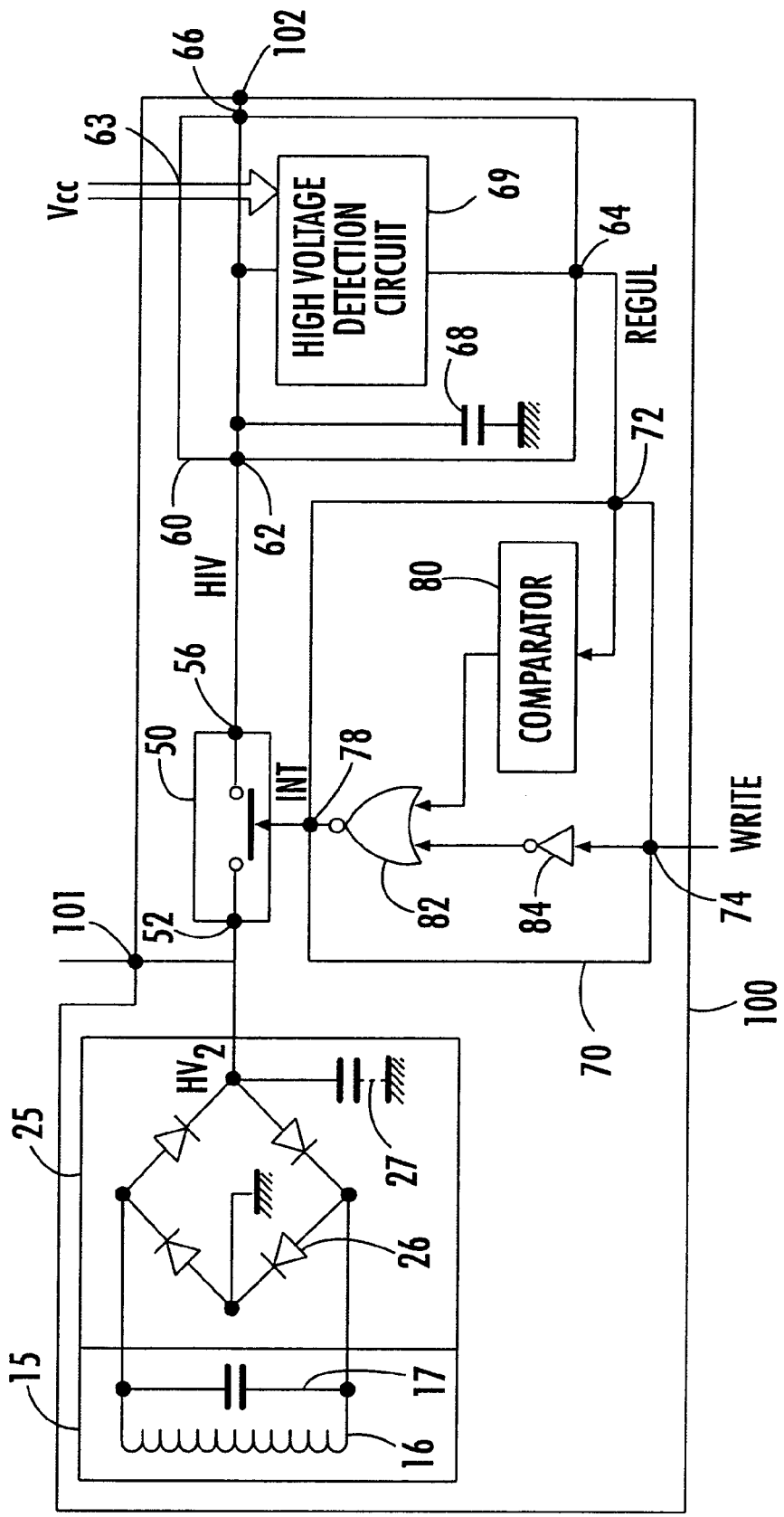
FIG. 3 is a block diagram illustrating the details of an element of the voltage production circuit of FIG. 2.

FIG. 3 shows an embodiment of the voltage production circuit 100 that integrates the three embodiments above, and presents all the advantages of these three circuits.

The circuit 100 of FIG. 3 comprises a controlled switch 50, a high voltage circuit 60 and a control circuit 70. The voltage production circuit 100 may also comprise a second detection circuit 15 and second rectifier circuit 25.

The controlled switch 50 comprises a high voltage input terminal 52 connected to the common point 23 to receive the rectified voltage $HV_1$ and an enabling input terminal 54. It gives an intermediate high voltage HIV at a high voltage output terminal 56. The controlled switch 50 is contituted by transistors according to a known scheme.

The high voltage circuit 60 includes a high voltage detection circuit 69 and a filtering capacitor 68 whose terminal is connected to ground. The high voltage circuit 60 gives a high programming voltage HT at a high voltage output terminal 66. The high voltage circuit 60 comprises a high voltage input terminal 62, a low voltage input terminal 63 to which the low supply voltage $V_{cc}$ is applied and a control output terminal 64 to give a regulation signal REGUL. The high voltage input terminal 62 is connected to the high voltage output terminal 56 of the controlled switch 50, the high voltage output terminal 66 of the high voltage circuit 60 as well as another terminal of the capacitor 68.

The control circuit 70 comprises a first enabling input terminal 72 connected to the control output terminal 64 of the high voltage circuit 60 to receive the regulation signal REGUL, a second enabling input terminal 74 to receive a control signal WRITE, and control output terminal 78 connected to the enabling input terminal 54 of the controlled switch 50 to provide a closing signal INT. The signal WRITE is given for example by the logic circuit of the memory 40. The control circuit 70 comprises a comparator 80, a logic gate 82, for example of the NOR type, and an inverter 84. The comparator 80 is for example a hysteresis comparator that converts an analog signal received at an input terminal into a digital signal given at an output terminal. For example, if the received analog signal increases, the comparator gives a logic "1" when the received analog signal has reached a first threshold $V_1$. Conversely, if the received analog signal decreases, the comparator gives a logic "0" when the received analog signal has reached a second threshold $V_2$, below $V_1$. The comparator 80 is formed of transistors according to known techniques.

The logic gate 82 comprises two input terminals connected respectively to the first enabling input terminal 72 by the comparator 80 and to the second enabling input terminal 74 by an inverter 86. The logic gate 82 gives the closing signal INT at an output terminal connected to the control output terminal 78.

Figure 4:
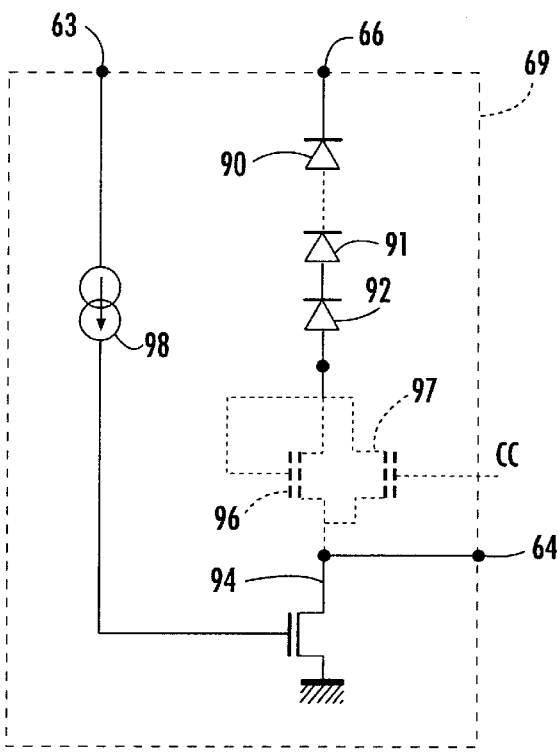
FIG. 4 is a block diagram illustrating the details of an element of the voltage production circuit of FIG. 3.

The high voltage detection circuit 69 comprises, in accordance with FIG. 4, n diodes 90 to 92, n being a number equal for example to three, a transistor 94 and a power source 98. The n diodes 90 to 92 are series-connected, the cathode of the diode 90 being connected to the high voltage input terminal 62 and the anode of the diode 92 being connected to the control output 64 and to the drain of the transistor 94, whose source is connected to ground. The n diodes 90 to 92 are, for example, Zener type diodes and have for example a threshold voltage $V_T$ equal to 5.3 V.

One of the terminals of the current source 98 is connected to the low voltage input terminal 63 and another terminal is connected to the gate of the transistor 94. The current given by the power source 98 biases the transistor 94 and preferably has a fairly low value, for example 500 nA, so as not to unnecessarily overload the voltage production circuit 100. The regulation signal REGUL, given by the high-voltage detection circuit 69 at the control output terminal 64, is an analog signal that depends on the number n of diodes 90 to 92, the threshold voltage $V_T$ of these diodes and the value of the high voltage HT at the high voltage output terminal 66. The regulation signal REGUL is thus equal to:

$$REGUL = HT - n * V_T \text{ if } HT - n * V_T^3 0$$

$$REGUL = 0 \text{ if } HT - n * V_T < 0$$

In the same way, the maximum value $V_{HT1}$ of the high voltage HT at the output terminal 66 depends on the number n of diodes 90 to 92, the threshold voltage $V_T$ of these diodes and the value of the first threshold $V_1$ of the comparator 80. For example, if we take a number of diodes n equal to three, in choosing Zener type diodes having a threshold voltage $V_T$ equal to 5.3 V, and in choosing a value of the first threshold $V_1$ equal to 1.1 V, the maximum value $V_{HT1}$ (or high threshold value) of the high voltage HT will be equal to $V_{HT1}=n*V_T+V_1$, that is $V_{HT1}=17$ V.

The high voltage detection circuit 69 can be improved by the insertion, between the diode 92 and the transistor 94, of two (optional) transistors 96 and 97 shown in dotted lines in FIG. 4. The drains of the transistors 96 and 97 are connected together to the anode of the diode 92 and their sources are connected together to the drain of the transistor 94. The gate and the drain of the transistor 96 are connected together to form a diode and the gate of the transistor 97 receives a control signal CC from the logic circuit 44 (the connection between the transistor 97 and the logic circuit 44 is not shown in FIGS. 2 and 3). When the control signal CC is equal to "1", the transistor 97 is on and transistor 96 is equivalent to a short circuit. Conversely, when the control signal CC is equal to "0", the transistor 97 is off and the transistor is equivalent to a diode, having a threshold voltage $V_T{}'$ equal to approximately 1 V. If, during the use of the voltage production circuit 100, it proves to be necessary to have a high voltage HT greater than the initially envisaged value, for example a value of 18 V, it will be enough to apply a control signal CC equal to "0" to the gate of the transistor 97. In this case, the maximum value $V_{HT1}$ of the high programming voltage obtained will be equal to $V_{HT1}=n*V_T+V_T{}'+V_1$.

This option is worthwhile insofar as, generally, in the course of time, the threshold voltages of the floating-gate transistors constituting the cells of the memory array 42 can be offset and can require the use of a high programming voltage HT higher than the initially envisaged voltage. This option is also worthwhile for carrying out procedures to test the quality of the integrated circuits during their manufacture.

The voltage production circuit 100 can also be improved by adding a second detection circuit 15 and a second rectifier circuit 25, represented by dotted lines in FIG. 2 and identical to the circuits 10 and 20, to provide a second rectified voltage $HV_2$. In this case, the output of the second rectifier circuit 25 must be connected to the high voltage input 52 of the controlled switch 50 and the connection between the common point 23 and the high voltage input 52 may be eliminated.

The voltage production circuit 100 can thus be considered in two different ways:

In a first embodiment, the circuit 100 receives a rectified voltage $HV_1$ given by external rectifier and detection circuits 10, 20 respectively. In this case, the circuit 100 gives a high voltage HT from the rectified voltage $HV_1$. In a second version, the circuit 100 comprises a second rectifier circuit 25 and a second detection circuit 15 that give a rectified voltage $HV_2$. In this case, the voltage production circuit 100 gives the high voltage HT from the rectified voltage $HV_2$. It can thus work autonomously, independently of the other circuits of the smart card, and especially of the low-voltage regulation circuit 34 and the modulation and demodulation circuit 36.

The second embodiment has the advantage of completely separating the voltage production circuit 100 and the low voltage regulation circuit 34 that gives the low supply voltage $V_{CC}$ to the circuits connected to it. Furthermore, the smart card thus receives approximately twice as much energy. This makes it possible to carry out several operations at the same time. For example data can be exchanged between the smart card and the reader, even when a memory write operation is in progress. Preferably, the components of the power circuits have to bear high voltages. Hence the detection circuits 10, 15, the rectifier circuits 20, 25, the controlled switch 50, and the high voltage circuit 60 in particular are power components designed to withstand the high voltages, for example $HV_1$, $HV_2$, HIV and HT, and the corresponding power values.

Figure 5A:
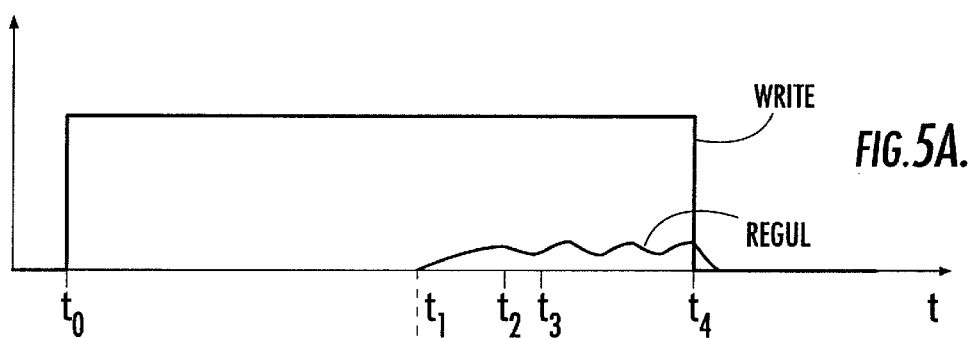
FIGS. 5a and 5b are timing diagrams of the signals at certain points of the voltage production circuit according to the invention.
Figure 5B:
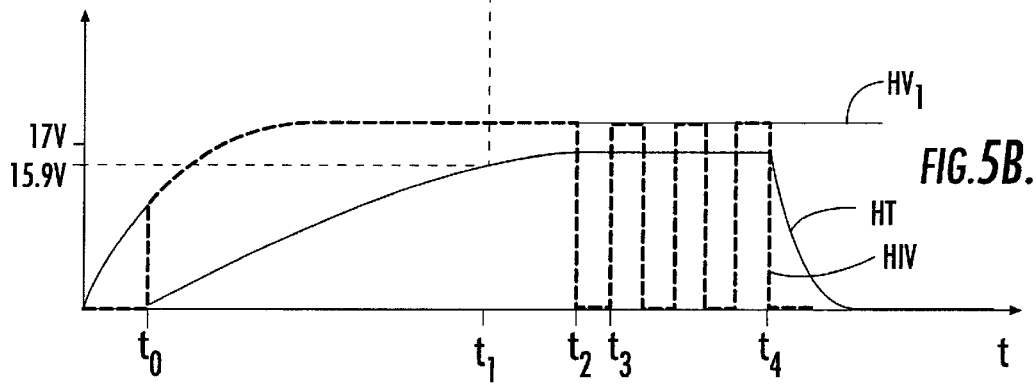

The operation of the voltage production circuit 100 of FIG. 3 shall now be described in relation to FIGS. 5a and 5b. To make it easier to understand these two figures, the scale has not been kept for the various signals. In the following example, which in no way restricts the scope of the invention, it is assumed that the smart card receives an RF signal at the point in time T=0. It is also assumed that the diodes 90 to 92 are three in number and have a threshold voltage $V_T$ equal to 5.3 V, and that the first and second thresholds $V_1$ and $V_2$ of the comparator 80 have respective values of 1.1 V and 1 V, to obtain a maximum value $V_{HT1}$ for the high voltage HT that is equal to 17 V.

Initially, during a period of time T ranging from 0 to $T_0$, no write operation is in progress, the control signal WRITE (FIG. 5a) as well as the control signal INT (not shown) have a logic value "0" and the controlled switch 50 is open. In this case, the intermediate high voltage HIV as well as the high voltage HT (FIG. 5b) are equal to zero. The rectified voltage $HV_1$ (or $HV_2$) at the terminals of the rectifier circuit 20 (or 25) rises quickly.

When a write operation is started, at the point in time $T=T_0$, the write control signal WRITE takes the logic value "1", as does the control signal INT. The controlled switch 50 gets closed, the intermediate high voltage HIV is equal to the rectified voltage $HV_1$ (or $HV_2$) and the high voltage HT increases slowly because of the presence of the filtering capacitor 68. The regulation signal REGUL is zero and the comparator 80 gives a logic zero "0".

When the high voltage HT reaches the value $n*V_T$ (i.e. 15.9 V in this example) at the point in time $T_1$, the regulation signal REGUL, which is initially zero, takes the value REGUL=HT−$n*V_T$ and increases with the high programming voltage HT, until it reaches the first threshold $V_1$ of the comparator 80 at the point in time $T_2$. At the point in time $T_2$, the comparator 80 gives a logic "1". The closing signal INT then takes the logic value "0". The consequence of this is the opening of the controlled switch 50. The intermediate voltage HIV in this case takes a zero value. The high voltage HT, for its part, does not drop sharply because of the presence of the filtering capacitor 68, but decreases slightly. The regulation signal REGUL also decreases until it reaches the second threshold $V_2$ of the comparator 80 at the point in time $T_3$ (the high voltage HT is then equal to $V_{HT2}=n*V_T+V_2=16.9$ V, which corresponds to a low threshold.

At the point in time $T_3$, the comparator 80 gives a logic "0" signal that causes the signal INT to pass to "1" and controlled switch 50 to get closed. The intermediate voltage HIV takes the value of the rectified voltage $HV_1$ (or $HV_2$) and the high voltage HT again increases slightly. The high voltage HT will thus vary slightly between a low threshold $V_{HT2}=16.9$ V and a high threshold $V_{HT1}=17$ V. The high voltage HT obtained is thus particularly stable.

At the point in time $T_4$, the write operation in the memory array ends and the high voltage HT is in this case no longer necessary. The write control signal WRITE takes the logic value "0", as does the control signal INT. This leads to the opening of the controlled switch 50. The intermediate high voltage HIV is in this case zero and the high voltage HT decreases slowly down to zero, as does the regulation signal REGUL, because of the energy stored in the filtering capacitor 68. The voltage production circuit 100 has thus returned to its initial state.

What is claimed is:

1. A circuit for producing a high programming voltage for programming a memory of a contactless smart card, the circuit comprising:
    a detection circuit and a rectifier circuit for producing a rectified voltage;
    a controlled switch that receives the rectified voltage, and gives an intermediate high voltage that is equal to the rectified voltage when the controlled switch is closed or equal to zero when the controlled switch is opened;
    a high voltage circuit having a high voltage input terminal for receiving the intermediate high voltage, a high voltage output terminal for outputting a high programming voltage, and a control output terminal for outputting a regulation signal to regulate the high programming voltage; and
    a control circuit that receives the regulation signal and a write control signal, and outputs a control signal to open and close the controlled switch.

2. A circuit according to claim 1, wherein the detection circuit and the rectifier circuit also produce a low supply voltage.

3. A circuit according to claim 1, wherein the control circuit comprises:
    a hysteresis comparator to compare the regulation signal with first and second thresholds and output a result of the comparison; and
    a logic gate comprising a first input receiving the result of the comparison and a second input receiving the write control signal, the logic gate providing the control signal.

4. A circuit according to claim 1, wherein the control signal has a first logic value for closing the controlled switch when the write control signal is in a first logic state and when the high programming voltage increases and is lower than a high threshold; wherein the control signal has a second logic value for opening the controlled switch when the write control signal is in the first logic state and when the high programming voltage decreases and is higher than a low threshold; and wherein the control signal has the second logic value for opening the controlled switch when the write control signal is in a second logic state.

5. A circuit according to claim 1, wherein the high voltage circuit comprises:
    at least one filtering capacitor to filter the intermediate high voltage; and
    a high voltage detection circuit to output the regulation signal.

6. A circuit according to claim 5, wherein the high voltage detection circuit further comprises:
    n substantially identical series-connected diodes connected between the high voltage input terminal and the control output;
    a transistor having a drain connected to the control output terminal, and a source connected to a reference potential; and
    a current source for turning on the transistor.

7. A circuit according to claim 6, wherein the high voltage detection circuit further comprises two transistors having drains connected together and sources connected together, between the series-connected diodes and the transistor, a gate of one of the two transistors being connected to its drain to form a diode, and a gate of a second one of the two transistors receiving a control signal.

8. A circuit for producing a high programming voltage for a memory of a smartcard, the circuit comprising:
   a rectifier circuit for producing a rectified voltage;
   a switch for receiving the rectified voltage, and providing an intermediate high voltage that is equal to the rectified voltage when the switch is in a first position and that is lower than the rectified voltage when the switch is in a second position;
   a high voltage circuit including
      a high voltage input terminal for receiving the intermediate high voltage,
      a high voltage output terminal for outputting a high programming voltage, and
      a control output terminal for outputting a regulation signal to regulate the high programming voltage; and
   a control circuit for outputting a control signal to open and close the switch based upon the regulation signal.

9. A circuit according to claim 8, wherein the rectifier circuit also produce a low supply voltage.

10. A circuit according to claim 8, wherein the control circuit comprises:
   a hysteresis comparator to compare the regulation signal with first and second thresholds and output a result of the comparison; and
   a logic gate having a first input for receiving the result of the comparison, a second input for receiving the write control signal, and an output for providing the control signal.

11. A circuit according to claim 8, wherein the control circuit outputs the control signal also based upon a write control signal from the memory.

12. A circuit according to claim 11, wherein the control circuit outputs the control signal as a first logic value to close the switch when the write control signal is in a first logic state and when the high programming voltage increases and is lower than a high threshold; wherein the control circuit outputs the control signal as a second logic value to open the switch when the write control signal is in the first logic state and when the high programming voltage decreases and is higher than a low threshold; and wherein the control circuit outputs the control signal as the second logic value to open the switch when the write control signal is in a second logic state.

13. A circuit according to claim 8, wherein the high voltage circuit comprises:
   at least one filtering capacitor to filter the intermediate high voltage; and
   a high voltage detection circuit to output the regulation signal.

14. A circuit according to claim 13, wherein the high voltage detection circuit further comprises:
   n substantially identical series-connected diodes connected between the high voltage input terminal and the control output;
   a first transistor having a drain connected to the control output terminal, and a source connected to a reference potential; and
   a current source for turning on the first transistor.

15. A circuit according to claim 14, wherein the high voltage detection circuit further comprises two second transistors having drains connected together and sources connected together, between the series-connected diodes and the transistor, a gate of one of the two second transistors being connected to its drain to form a diode, and a gate of another one of the two second transistors receiving a control signal.

16. A circuit according to claim 8, wherein the switch is closed in the first position and open in the second position.

17. A contactless chip card comprising:
   programmable memory; and
   a circuit for producing a high programming voltage for the programmable memory, the circuit comprising
      a detection circuit and a rectifier circuit for producing a rectified voltage from a received power signal,
      a switch for receiving the rectified voltage, and providing an intermediate high voltage that is equal to the rectified voltage when the switch is in a first position and that is lower than the rectified voltage when the switch is in a second position,
      a high voltage circuit including a high voltage input terminal for receiving the intermediate high voltage, a high voltage output terminal for outputting a high programming voltage, and a control output terminal for outputting a regulation signal to regulate the high programming voltage, and
      a control circuit for outputting a control signal to open and close the switch based upon the regulation signal.

18. A contactless chip card according to claim 17, wherein the detection circuit and the rectifier circuit also produce a low supply voltage.

19. A contactless chip card according to claim 17, wherein the control circuit comprises:
   a hysteresis comparator to compare the regulation signal with first and second thresholds and output a result of the comparison; and
   a logic gate having a first input for receiving the result of the comparison, a second input for receiving the write control signal, and an output for providing the control signal.

20. A contactless chip card according to claim 17, wherein the control circuit outputs the control signal also based upon a write control signal from the memory.

21. A contactless chip card according to claim 20, wherein the control circuit outputs the control signal as a first logic value to close the switch when the write control signal is in a first logic state and when the high programming voltage increases and is lower than a high threshold; wherein the control circuit outputs the control signal as a second logic value to open the switch when the write control signal is in the first logic state and when the high programming voltage decreases and is higher than a low threshold; and wherein the control circuit outputs the control signal as the second logic value to open the switch when the write control signal is in a second logic state.

22. A contactless chip card according to claim 17, wherein the high voltage circuit comprises:
   at least one filtering capacitor to filter the intermediate high voltage; and
   a high voltage detection circuit to output the regulation signal.

23. A contactless chip card according to claim 22, wherein the high voltage detection circuit further comprises:
   n substantially identical series-connected diodes connected between the high voltage input terminal and the control output;
   a first transistor having a drain connected to the control output terminal, and a source connected to a reference potential; and
   a current source for turning on the first transistor.

24. A contactless chip card according to claim 23, wherein the high voltage detection circuit further comprises two second transistors having drains connected together and sources connected together, between the series-connected diodes and the transistor, a gate of one of the two second transistors being connected to its drain to form a diode, and a gate of another one of the two second transistors receiving a control signal.

25. A method for producing a high programming voltage for a memory in a smartcard, the method comprising:
   producing a rectified voltage;
   controlling a switch for providing an intermediate high voltage that is equal to the rectified voltage when the switch is in a first position and that is lower than the rectified voltage when the switch is in a second position;
   providing a high voltage circuit including
      a high voltage input terminal for receiving the intermediate high voltage,
      a high voltage output terminal for outputting a high programming voltage, and
      a control output terminal for outputting a regulation signal to regulate the high programming voltage; and
   generating a control signal to open and close the switch based upon the regulation signal.

26. A method according to claim 25, wherein the control signal is generated by:
   providing a hysteresis comparator to compare the regulation signal with first and second thresholds and output a result of the comparison; and
   providing a logic gate having a first input for receiving the result of the comparison, a second input for receiving the write control signal, and an output for providing the control signal.

27. A method according to claim 25, wherein the control signal is also generated based upon a write control signal from the memory.

28. A method according to claim 27, wherein the control signal has a first logic value to close the switch when the write control signal is in a first logic state and when the high programming voltage increases and is lower than a high threshold; wherein the control signal has a second logic value to open the switch when the write control signal is in the first logic state and when the high programming voltage decreases and is higher than a low threshold; and wherein the control signal has the second logic value to open the switch when the write control signal is in a second logic state.

29. A method according to claim 25, wherein the high voltage circuit comprises:
   at least one filtering capacitor to filter the intermediate high voltage; and
   a high voltage detection circuit to output the regulation signal.

30. A method according to claim 29, wherein the high voltage detection circuit further comprises:
   n substantially identical series-connected diodes connected between the high voltage input terminal and the control output;
   a first transistor having a drain connected to the control output terminal, and a source connected to a reference potential; and
   a current source for turning on the first transistor.

31. A method according to claim 30, wherein the high voltage detection circuit further comprises two second transistors having drains connected together and sources connected together, between the series-connected diodes and the transistor, a gate of one of the two second transistors being connected to its drain to form a diode, and a gate of another one of the two second transistors receiving a control signal.

32. An integrated circuit comprising:
   a detection circuit and a rectifier circuit, series-connected to provide a rectified voltage;
   a low-voltage regulation circuit that receives the rectified voltage and provides a low voltage; and
   a voltage production circuit that receives the rectified voltage and produces a high voltage different from the low voltage.

33. The circuit according to claim 32, further comprising a memory including a memory array, the memory array receiving the low voltage and the high voltage.

34. The circuit according to claim 32, wherein the voltage production circuit comprises a wire connected between an output terminal of the rectifier circuit and an input terminal of the memory array.

35. The circuit according to claim 32, wherein the voltage production circuit comprises a controlled switch that is closed when it receives an active control signal and open otherwise.

36. The circuit according to claim 32, wherein the voltage production circuit comprises:
   a controlled switch which receives the rectified voltage and provides an intermediate voltage that is equal to the rectified voltage when the switch is closed and to zero when the switch is open; and
   a high voltage circuit that receives the intermediate voltage, provides the high voltage and controls the switch to regulate the high voltage.

37. The circuit according to claim 32, wherein the voltage production circuit comprises:
   a controlled switch which receives the rectified voltage and provides and intermediate voltage;
   a high voltage circuit that receives the intermediate voltage, and provides the high voltage and a regulation signal to regulate the high voltage; and
   a control circuit that receives the regulation signal and a write signal and provides a switch signal to control the controlled switch.

38. The circuit according to claim 37, wherein the control circuit comprises:
   a hysteresis comparator to compare the regulation signal with first and second thresholds and provide a result of the comparison at an output of the comparator; and
   a logic gate comprising a first input to receive the result of the comparison and a second input to receive the write signal, the logic gate providing the switch signal.

39. The circuit according to claim 37, wherein the switch signal has a first logic value that leads to the closing of the controlled switch when the write signal is in a first logic state and when the high voltage increases and is lower than a high threshold; wherein the switch signal has a second logic value that leads to the opening of the switch when the write signal is in the first logic state and when the high voltage decreases and is higher than a low threshold; and wherein the switch signal has a second logic value that leads to the opening of the switch when the write signal is in a second logic state.

40. The circuit according to claim 37, wherein the high voltage circuit comprises:
   at least one filtering capacitor to filter the intermediate voltage; and a high voltage detection circuit to provide the regulation signal.

41. The circuit according to claim 40, wherein the high voltage detection circuit comprises:

n identical series-connected diodes, a cathode of the first diode being connected to a high voltage input terminal of the high voltage circuit and an anode of the nth diode being connected to a control output terminal of the high voltage circuit;

a transistor having a drain connected to the control output terminal and a source connected to ground; and a current source connected to the transistor to turn it on.

42. The circuit according to claim 41, wherein the high voltage detection circuit further comprises two additional transistors having drains connected together and to the anode of the nth diode, sources connected together and to the drain of the transistor, the gate of one of the additional transistors being connected to its drain to form a diode and the gate of the other additional transistor receiving a control signal.

43. The circuit according to claim 32, further comprising a second detection circuit and a second rectifier circuit to provide a second rectified voltage, the voltage production circuit producing the high voltage from the second regulated voltage.

44. A smart card comprising:

a programmable memory; and a circuit for producing a high programming voltage for the programmable memory, the circuit comprising a detection circuit and a rectifier circuit, series-connected to provide a rectified voltage, a low-voltage regulation circuit that receives the rectified voltage and provides a low voltage, and a voltage production circuit that receives the rectified voltage and produces a high voltage different from the low voltage.

45. The smart card according to claim 44, wherein the voltage production circuit comprises a wire connected between an output terminal of the rectifier circuit and an input terminal of the memory array.

46. The smart card according to claim 44, wherein the voltage production circuit comprises a controlled switch that is closed when it receives an active control signal and open otherwise.

47. The smart card according to claim 44, wherein the voltage production circuit comprises:

a controlled switch which receives the rectified voltage and provides an intermediate voltage that is equal to the rectified voltage when the switch is closed and to zero when the switch is open; and a high voltage circuit that receives the intermediate voltage, provides the high voltage and controls the switch to regulate the high voltage.

48. The smart card according to claim 44, wherein the voltage production circuit comprises:

a controlled switch which receives the rectified voltage and provides and intermediate voltage;

a high voltage circuit that receives the intermediate voltage, and provides the high voltage and a regulation signal to regulate the high voltage; and a control circuit that receives the regulation signal and a write signal and provides a switch signal to control the controlled switch.

49. The smart card according to claim 48, wherein the control circuit comprises:

a hysteresis comparator to compare the regulation signal with first and second thresholds and provide a result of the comparison at an output of the comparator; and a logic gate comprising a first input to receive the result of the comparison and a second input to receive the write signal, the logic gate providing the switch signal.

50. The smart card according to claim 48, wherein the switch signal has a first logic value that leads to the closing of the controlled switch when the write signal is in a first logic state and when the high voltage increases and is lower than a high threshold; wherein the switch signal has a second logic value that leads to the opening of the switch when the write signal is in the first logic state and when the high voltage decreases and is higher than a low threshold; and wherein the switch signal has a second logic value that leads to the opening of the switch when the write signal is in a second logic state.

51. The smart card according to claim 48, wherein the high voltage circuit comprises:

at least one filtering capacitor to filter the intermediate voltage; and a high voltage detection circuit to provide the regulation signal.

52. The smart card according to claim 51, wherein the high voltage detection circuit comprises:

n identical series-connected diodes, a cathode of the first diode being connected to a high voltage input terminal of the high voltage circuit and an anode of the nth diode being connected to a control output terminal of the high voltage circuit;

a transistor having a drain connected to the control output terminal and a source connected to ground; and a current source connected to the transistor to turn it on.

53. The smart card according to claim 52, wherein the high voltage detection circuit further comprises two additional transistors having drains connected together and to the anode of the nth diode, sources connected together and to the drain of the transistor, the gate of one of the additional transistors being connected to its drain to form a diode and the gate of the other additional transistor receiving a control signal.

54. The smart card according to claim 44, wherein the circuit further comprises a second detection circuit and a second rectifier circuit to provide a second rectified voltage, the voltage production circuit producing the high voltage from the second regulated voltage.

* * * * *

UNITED STATES PATENT AND TRADEMARK OFFICE
CERTIFICATE OF CORRECTION

PATENT NO. : 6,621,720 B1
DATED : September 16, 2003
INVENTOR(S) : Devin et al.

It is certified that error appears in the above-identified patent and that said Letters Patent is hereby corrected as shown below:

Title page,
Item [56], References Cited, U.S. PATENT DOCUMENTS, insert:
-- 5,285,370  2/8/94  Axer et al. .......... 363/59
5,572,478   11/5/96  Sato et al. ................365/226 --
Insert: -- FOREIGN PATENT DOCUMENTS
EP 0917064    5/1999 --

Column 3,
Line 43, delete "tothe" insert -- to the --

Column 4,
Line 21, delete "FIG. 3;, and" insert -- FIG. 3; and --
Between lines 42-43, insert: -- According to another embodiment (not shown in detail), the voltage production circuit 100 comprises a switch controlled by a control signal WRITE, provided for example by the logic circuit 42 of the memory 40 or by the logic circuit 38. When the switch 50 is closed, the high voltage, equal to the rectified voltage, is applied to the memory array. --
Line 60, delete "contituted" insert -- constituted --

Column 5,
Line 57, delete "REGUL = HT - n*$V_T$ if HT - n*$V^3_T$0" insert
-- REGUL = HT - n*$V_T$ if HT - n*$V_T \geq 0$ --

Column 6,
Lines 48 and 60, delete "embodiment" insert -- version --

Column 7,
Lines 24 and 65-66, delete "intermediate high voltage" insert
-- intermediate voltage --

Column 9,
Line 22, delete "also produce" insert -- also produces --

UNITED STATES PATENT AND TRADEMARK OFFICE
CERTIFICATE OF CORRECTION

PATENT NO. : 6,621,720 B1
DATED : September 16, 2003
INVENTOR(S) : Devin et al.

It is certified that error appears in the above-identified patent and that said Letters Patent is hereby corrected as shown below:

Column 10,
Line 6, delete "programmable" insert -- a programmable --

Column 12,
Line 38, delete "provides and intermediate" insert -- provides an intermediate --

Signed and Sealed this

Sixth Day of January, 2004

JAMES E. ROGAN
*Director of the United States Patent and Trademark Office*